(12) United States Patent
Walters

(10) Patent No.: US 9,153,516 B2
(45) Date of Patent: Oct. 6, 2015

(54) VOIDLESSLY ENCAPSULATED SEMICONDUCTOR DIE PACKAGE

(71) Applicant: Microsemi Corporation, Aliso Viejo, CA (US)

(72) Inventor: Cecil Kent Walters, Scottsdale, AZ (US)

(73) Assignee: Microsemi Corporation, Aliso Viejo, CA (US)

( * ) Notice: Subject to any disclaimer, the term of this patent is extended or adjusted under 35 U.S.C. 154(b) by 0 days.

(21) Appl. No.: 14/258,775

(22) Filed: Apr. 22, 2014

(65) Prior Publication Data

US 2014/0319541 A1    Oct. 30, 2014

Related U.S. Application Data

(60) Provisional application No. 61/817,770, filed on Apr. 30, 2013.

(51) Int. Cl.
| | |
|---|---|
| *H01L 23/31* | (2006.01) |
| *H01L 29/16* | (2006.01) |
| *H01L 23/00* | (2006.01) |
| *H01L 23/051* | (2006.01) |
| *H01L 23/488* | (2006.01) |

(52) U.S. Cl.
CPC .......... *H01L 23/3107* (2013.01); *H01L 23/051* (2013.01); *H01L 23/488* (2013.01); *H01L 24/33* (2013.01); *H01L 29/1608* (2013.01); *H01L 2224/33051* (2013.01); *H01L 2924/00* (2013.01); *H01L 2924/0002* (2013.01); *H01L 2924/01042* (2013.01); *H01L 2924/01074* (2013.01); *H01L 2924/01079* (2013.01); *H01L 2924/12032* (2013.01)

(58) Field of Classification Search
CPC . H01L 23/3107; H01L 29/1608; H01L 24/33; H01L 2224/33051; H01L 2924/01042; H01L 2924/01074
USPC .............................................. 257/77; 438/127
See application file for complete search history.

(56) References Cited

U.S. PATENT DOCUMENTS

| | | | | |
|---|---|---|---|---|
| 3,447,236 A | * | 6/1969 | Hatcher, Jr. .................... | 228/175 |
| 3,844,029 A | * | 10/1974 | Dibugnara ....................... | 29/855 |
| 4,564,885 A | * | 1/1986 | McCann ......................... | 361/436 |
| 4,829,406 A |  | 5/1989 | Korwin-Pawlowski | |
| 5,008,735 A | * | 4/1991 | Edmond et al. ................. | 257/77 |
| 5,248,902 A |  | 9/1993 | Hsu | |
| 5,904,555 A |  | 5/1999 | Darbha et al. | |

OTHER PUBLICATIONS

International Search Report and Written Opinion of the International Searching Authority for related application PCT/US2014/035013 dated Aug. 5, 2014.

* cited by examiner

*Primary Examiner* — Roy Potter
(74) *Attorney, Agent, or Firm* — Allen J. Moss; Squire Patton Boggs (US) LLP

(57) ABSTRACT

A system can include a semiconductor die having a first side and a second side opposite the first side. The system can also include a first slug coupled to a portion of the first side of the die. The system can further include a second slug coupled to a portion of the second side of the die. The system can additionally include an insulating material voidlessly encapsulating the die. The first slug can include a first portion having a first width in proximity to the die and a second portion having a second width. The first portion can be closer than the second portion to the die and the first width can be smaller than the second width.

42 Claims, 11 Drawing Sheets

VOIDLESSLY ENCAPSULATED SEMICONDUCTOR DIE PACKAGE

CROSS-REFERENCE TO RELATED APPLICATION

This application is a non-provisional of and claims priority to U.S. Provisional Patent Application No. 61/817,770, entitled VOIDLESSLY ENCAPSULATED SEMICONDUCTOR DIE PACKAGE, filed Apr. 30, 2013, the disclosure of which is hereby incorporated by reference in its entirety.

BACKGROUND

1. Field

Certain embodiments of the present invention may relate generally to semiconductor dies, packages including such dies, and systems, components, and devices incorporating such dies and packages, as well as to methods for assembling such dies, packages, systems and the like. For example, rectifier, Zener, transient voltage suppressor or Schottky diodes may include voidlessly encapsulated semiconductor mesa dies.

2. Description of the Related Art

FIG. 1 illustrates a mesa die 110 in a double-plug package according to the prior art. As shown in FIG. 1, a mesa die 110 can include a junction 130 in a plateau section of the mesa die 110 with passivation layers 140 at the perimeter on one end side of the mesa die 110. A first slug 120 and a second slug 125 can sandwich the mesa die 110. The first slug 120 and the second slug 125 can be identical to one another and can be made of Molybdenum or Tungsten. To achieve the plateau shape, the mesa die 110 can be etched or otherwise patterned. The mesa die 110 can be encapsulated by glass sleeve body 150. The term double plug can refer to the pair of slugs, thus interchangeably utilizing the words plug and slug.

The double plug or slug diodes with a silicon mesa die may be relatively easy to assemble with adjoining plugs since the entire cylindrical diameter of the plug can cover the mesa contact region of the die. As a result, no orientation is needed and the glass body only needs to flow in towards the edge of the die or mesa perimeter to become voidless.

The above assembly is quite useful for mesa dies, however it is not easily adaptable for use with planar shaped dies, such as those common with silicon carbide devices.

SUMMARY

A system, according to certain embodiments, can include a semiconductor die having a first side and a second side opposite the first side. The system can also include a first slug coupled to a portion of the first side of the die. The system can further include a second slug coupled to a portion of the second side of the die. The system can additionally include an insulating material voidlessly encapsulating the die. The first slug may include a first portion having a first width in proximity to the die and a second portion having a second width, wherein the first portion may be located closer than the second portion to the die and the first width may be smaller than the second width.

A method of manufacture, in certain embodiments, can include coupling a first slug to a portion of a first side of a semiconductor die having the first side and a second side opposite the first side. The method can also include coupling a second slug to a portion of the second side. The method can further include voidlessly encapsulating the die with an insulating material. The first slug can include a first portion having a first width in proximity to the die and a second portion having a second width. The first portion can be closer than the second portion to the die and the first width may be smaller than the second width.

BRIEF DESCRIPTION OF THE DRAWINGS

For proper understanding of the invention, reference should be made to the accompanying drawings, wherein.

DETAILED DESCRIPTION

The SiC Schottky of certain embodiments of the present invention may use a planar die rather than a mesa die for silicon p-n junctions or Schottkys for voidless glass packages. Using a planar die may be beneficial in view of the SiC chemical resistance properties. It may be very difficult to chemically etch SiC to provide a mesa die configuration in a wafer fabrication process. The voidless glass SiC Schottky packages of certain embodiments of the present invention may use a tapered slug on the planar-pattern side of the die.

Figure 2:
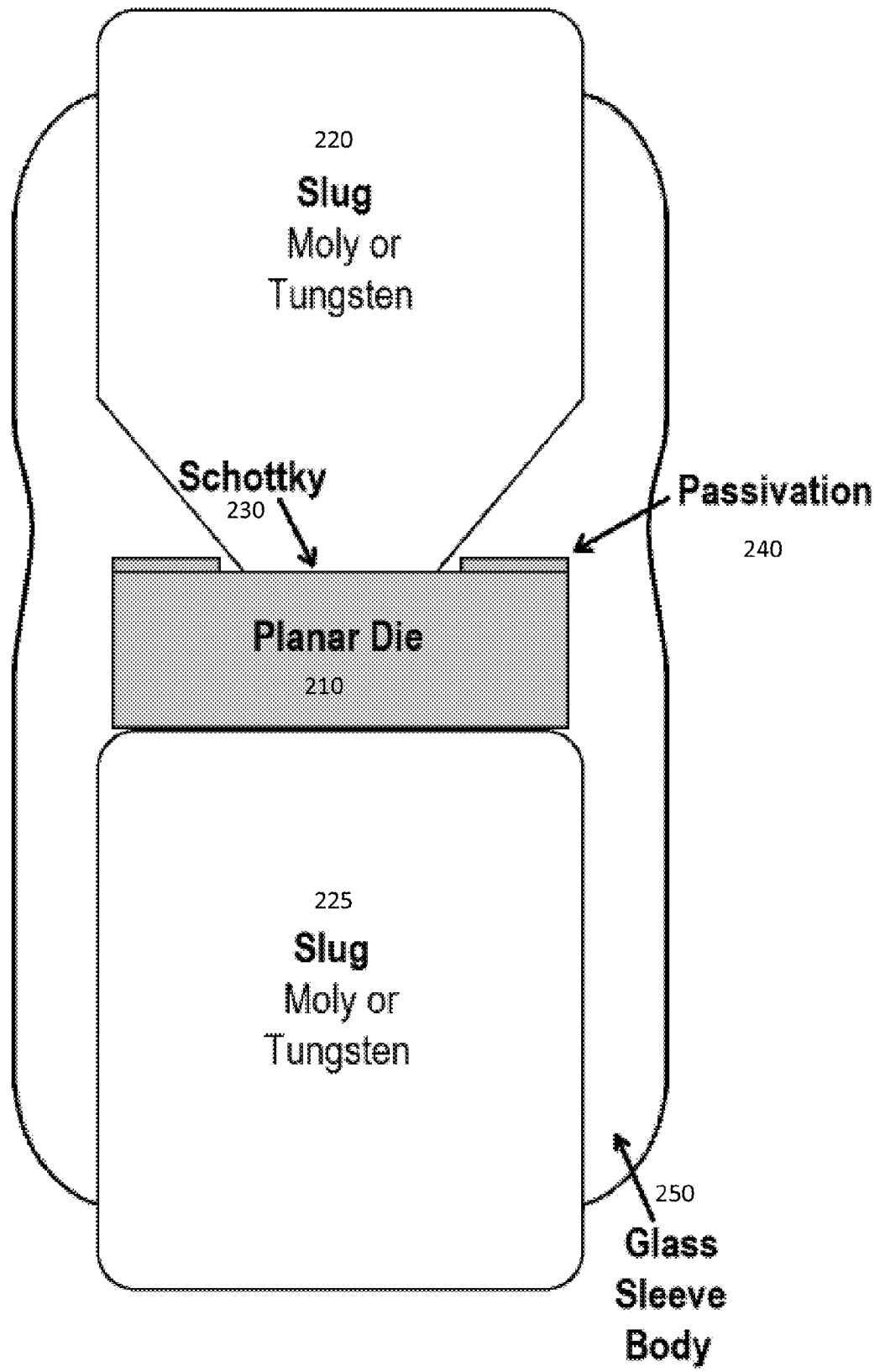
FIG. 2 illustrates a planar die in a double-plug package, according to certain embodiments of the present invention.

FIG. 2 illustrates a planar die in a double-plug package, according to certain embodiments of the present invention. As shown in FIG. 2, a planar die 210 can include a Schottky diode 230 on a portion of a top surface of the planar die 210 with passivation layers 240 on the perimeter top surface of the planar die 210. A first slug 220 and a second slug 225 can sandwich the planar die 210. The first slug 220 can be different from or the same as the second slug 225 in shape, size, fabrication material or any other slug-related parameter. For example, both slugs 220 and 225 can be made of Molybdenum or Tungsten, or the slugs 220 and 225 could be made of differing materials, whether Molybdenum, Tungsten or other materials. The planar die 210 can be voidlessly encapsulated by glass sleeve body 250 or any other desired material. First slug 220 can exhibit a first width in contact with planar die 210, and a second width at a point removed from the contact point, the second width greater than the first width.

Figure 1:
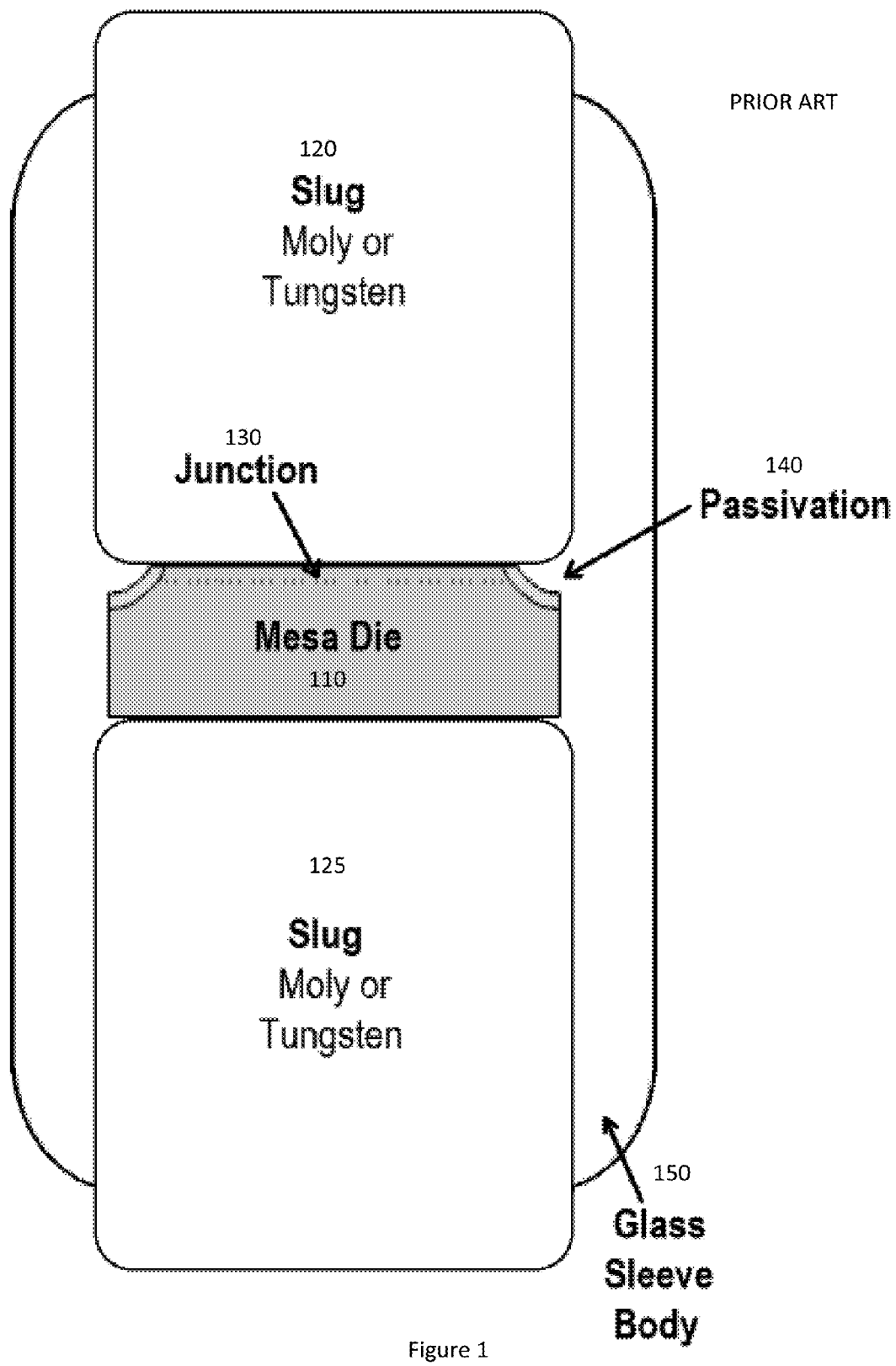
FIG. 1 illustrates a mesa die in a double-plug package according to the prior art.

Conversely, employing a planar die (or other die type) with the prior art double-plug design shown in FIG. 1 can leave voids, making the package more susceptible to issues such as arcing. For example, a planar die, such as planar die 210, may be electrically contacted to an anode with a cylindrical plug, such as the plug 120 of FIG. 1, where the planar die 210 has a slightly raised metalized contact window or "bump" on the anode pattern side, to make electrical contact in the double-plug package. The subsequent glass sealing surrounding the plug might appear to be voidless. However, there may still be a small thin gap or space remaining between the plug (again, referring to a cylindrical plug, such as plug 120 of FIG. 1) and the face of the planar die extending outside of the raised metalized contact window to the die edge. The extended surface region can be passivated in the wafer fabrication process. Nevertheless, such a design may leave a thin cavity region for possible dielectric breakdown of trapped gas and also may compromise the distance between the anode plug terminal and the cathode edge of the die. In contrast, the tapered slug geometry of embodiments of the present invention (as exemplified in FIG. 2) may prevent the creation of such a void or a short distance between anode and cathode and avoid the resulting internal arcing and similar effects. Although a planar die is illustrated in FIG. 2, a tapered slug design can also be used with a mesa die, such as the mesa die illustrated in FIG. 1. Such an embodiment may further assist in separation, for example, for a very high voltage device, or for enhancing glass collapse or sealing.

Limitations of glass (or other insulating or dielectric material) flow into a thin region may be avoided when the tapered angle of the plug is not too shallow relative to the flat contact portion of the plug to die. The taper may also avoid being too steep of an angle so as to avoid compromising the remaining outer diameter cylindrical region of the plug for glass body compression sealing.

Amorphous solids, such as glass, may inevitably include voids at some scale of analysis. However, for the purposes of this analysis, voids ordinarily occurring within the glass are not considered to be voids. By contrast, voids occurring because glass (or other insulating or dielectric material) was not able to flow into and seal the area between a plug and a die may be considered voids.

Figure 3:
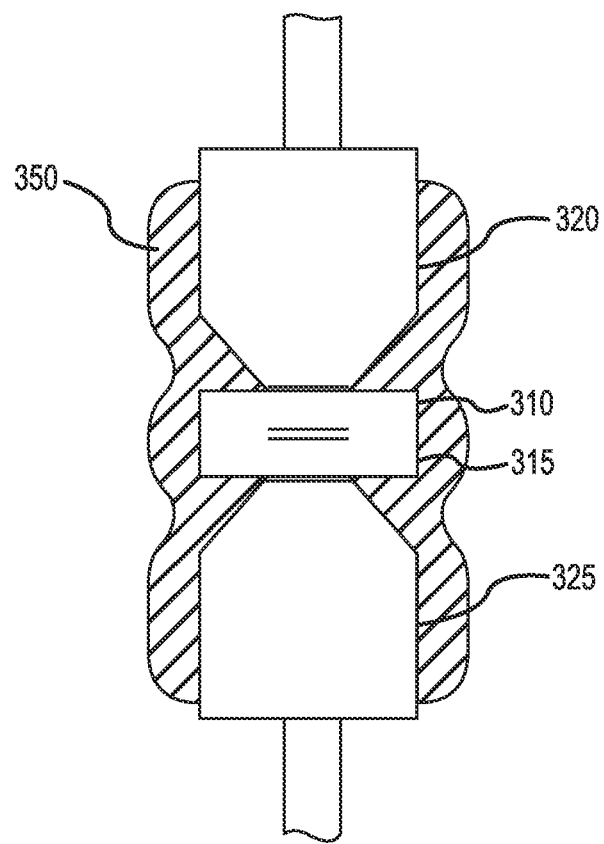
FIG. 3 illustrates back-to-back planar dies in a double-plug package, according to certain embodiments of the present invention.

FIG. 3 illustrates back-to-back planar dies in a double-plug package, according to certain embodiments of the present invention. As shown in FIG. 3, a first die 310 and a second die 315 can be arranged back-to-back. In other words, patterned sides of dies 310 and 315 can face away from one another. Dies 310 and 315 may be planar dies. A first tapered slug 320 can be coupled to the first die 310 and a second tapered slug 325 can be coupled to the second die 315. Insulating body material 350 can voidlessly encapsulate both the first die 310 and the second die 315. FIG. 3 does not show passivation layers, but passivation layers can be provided outside of the contact area between the first die 310 and the first tapered slug 320 and outside of the contact area between the second die 315 and the second tapered slug 325. This package may be used as or to construct a transient voltage suppressor (TVS), for example, a bi-directional TVS or any other desired sub-component, component, device or system.

Figure 4:
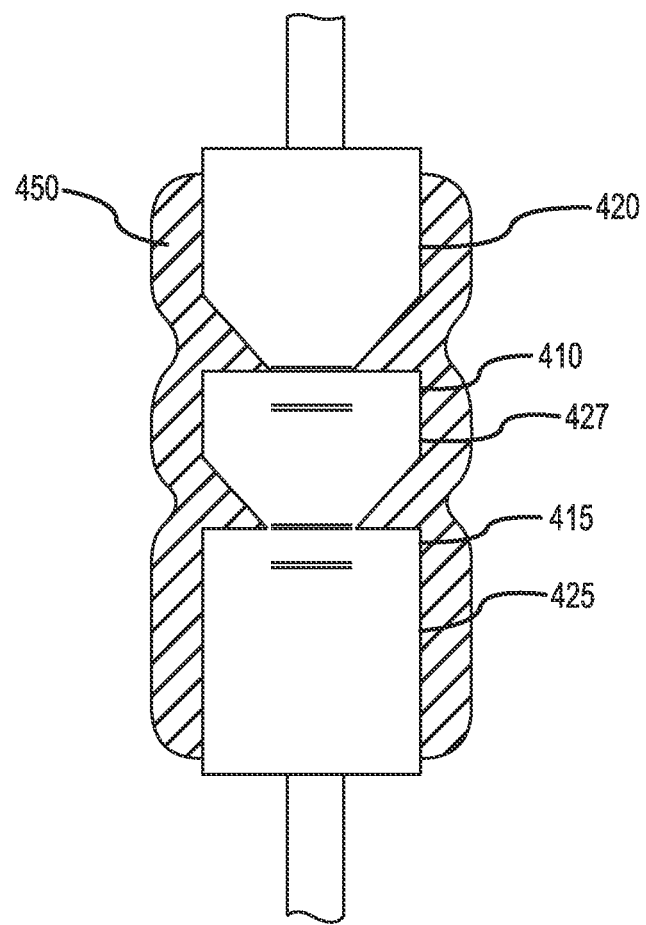
FIG. 4 illustrates planar dies in a multiple-plug package, according to certain embodiments of the present invention.

FIG. 4 illustrates planar dies in a multiple-plug package, according to certain embodiments of the present invention. As shown in FIG. 4, a first die 410 and a second die 415 can be arranged spaced apart from each other and sandwiched between a first tapered slug 420 and a cylindrical slug 425. A second tapered slug 427 can be placed between the first die 410 and the second die 420, separating them. In certain embodiments of the present invention, the second tapered slug 427 can be shorter in length than the first tapered slug 420 or cylindrical slug 425. Cylindrical slug 425 may simply be a conventional cylindrical slug. Insulating body material 450 can voidlessly encapsulate both dies 410, 415. This package may be used for series rectifiers, with the dies facing the same direction (for example, package side up), for higher voltages or with any other desired sub-component, component, device or system.

Figure 11:
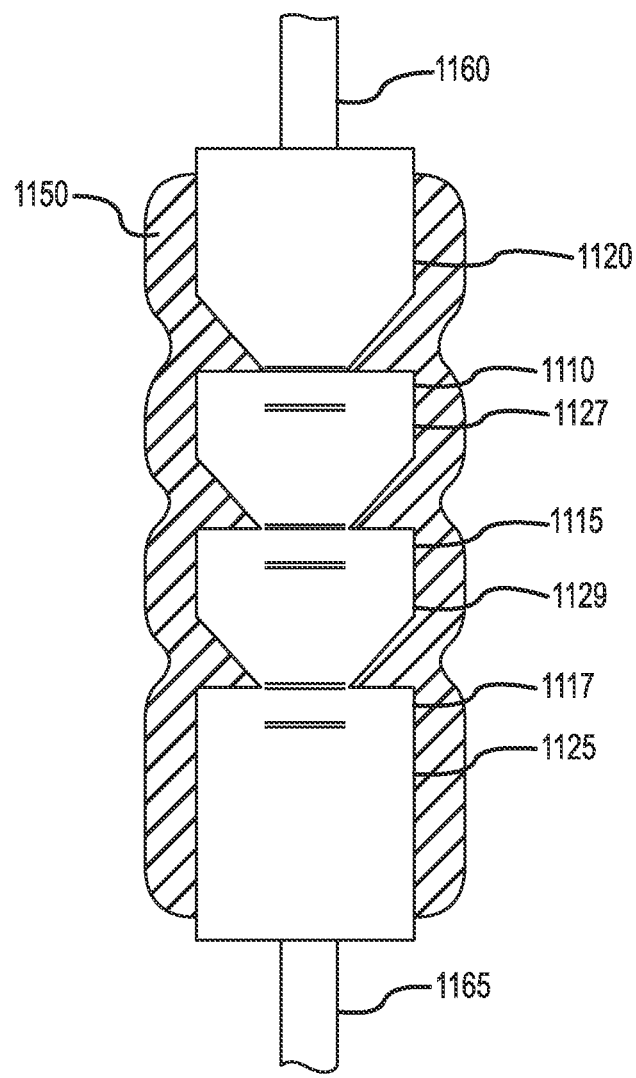
FIG. 11 illustrates planar dies in another multiple-plug package, according to certain embodiments of the present invention.

FIG. 11 illustrates planar dies in another multiple-plug package, according to certain embodiments of the present invention. The multiple plug package with multiple planar dies may be used, for example, to provide series rectifiers. As shown in FIG. 11, a first die 1110 may be placed between first tapered slug 1120 and second tapered slug 1127. Moreover, a second die 1115 may be placed between the second tapered slug 1127 and third tapered slug 1129. Furthermore, a third die 1117 may be placed between the third tapered slug 1129 and a cylindrical slug 1125. An insulating body material 1150 may encapsulate all of the dies 1110, 1115, and 1117. A first lead 1160 can be connected to an end of tapered slug 1120 opposite first die 1110, and a second lead 1165 can be attached to an end of the cylindrical slug 1125 opposite the third die 1117. It is not necessary to use a cylindrical slug as the final slug of the package. Moreover, the pattern of slug, die, slug, die, and so on can be extended indefinitely, with no requirement that the limit be three dies. Leads or surface mount connectors can then be attached to the outermost slugs of the series. Insulating body material 1150 is shown as a single sheath that has been applied to the package. In certain embodiments, multiple sheaths can be applied either concentrically or in series. For example, a first sheath could be used to encapsulate the first die 1110, a second sheath could be used to encapsulate the second die 1115, and so on.

Figure 5A:
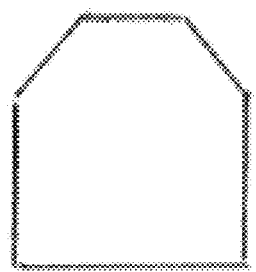
FIGS. 5A-5D illustrate vertical cross-sections of tapered slugs according to certain embodiments of the present invention.

FIGS. 5A-5D illustrate vertical cross-sections of tapered slugs according to certain embodiments of the present invention. FIG. 5A illustrates a vertical cross-section of a tapered slug having a linear taper. As shown, the angle of the taper may be about 45 degrees. More generally, the tapered angle of a tapered slug for any embodiment of the present invention may be from about 10 degrees to about 80 degrees. The resultant shape of the tapered end of the slug may be that of a truncated cone. The truncation is shown as being about halfway along the length of the cone, and may be selected based on the size of the area to which the slug is to contact as well as glass body sealing and shape.

Figure 5B:
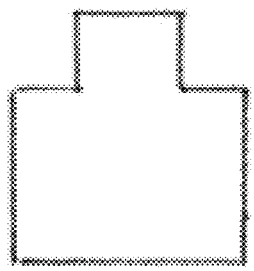

FIG. 5B illustrates a vertical cross-section of a tapered slug having a stepped taper. A single step is shown, but multiple steps are also permitted. For example, steps may be used to approximate the liner taper illustrated in FIG. 5A. The step that is shown is reducing the diameter of the slug by about fifty percent. Other percentages of reduction are also possible, and the amount of reduction in the step may be configured based on the contact area for the slug. The tapered angle for this slug embodiment may, for example, be 85 to 90 degrees, referring to the angle between the stepped region of the slug (the upper extended surface of the slug) and the die surface.

Figure 5C:
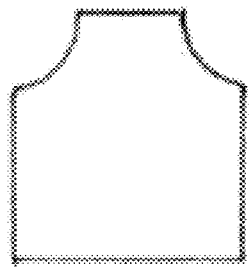

FIG. 5C illustrates a vertical cross-section of a tapered slug having a concave taper. The degree of concavity can be variously adjusted ranging from close to the linear embodiment shown in FIG. 5A to close to the stepped embodiment shown in FIG. 5B. Alternatively, the taper may be a convex taper.

Figure 5D:
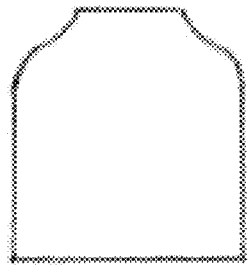

FIG. 5D illustrates a vertical cross-section of a tapered slug having a convex-concave taper. From the broadest point inward, the taper, as illustrated, is first convex and then concave. Thus, the taper may be described as S-shaped. In this embodiment, the S-shape has a moderate degree. The S-shape taper may be very slight so as to approximate the linear taper shown in FIG. 5A or may be dramatic, so as to approximate the stepped taper shown in FIG. 5B or may be any range in between the two. Alternatively, the taper may first be concave and then convex. This kind of taper can also be described as S-shaped.

Thus, a variety of variations of slug geometry can be categorized as a tapered slug or plug. These variations may be configured to enable glass flow into the region across the top planar side of the die during the sealing process. This may provide for high-dielectric-strength glass (or other insulating or dielectric material) between anode and cathode on the planar die surface to ensure there is no dielectric breakdown or arc-over of any remaining gas or cavity on the planar side of the die.

For example, in a stepped-down diameter slug (such as shown in FIG. 5B), the slug may be provided with sufficient pedestal height to still ensure glass flow into the region across the upper surface of the die. That may also be viable if there is sufficient height, for example, more than 0.005 inches (0.127 mm) for the height of the pedestal.

In embodiments with sharp angles or sharp corners, there may be glass stress issues after sealing due to the sharp angles or corners. Thus, in certain embodiments of the present invention, some or all of these sharp angles may be rounded or smoothed.

Certain embodiments of the present invention may also exaggerate the hour-glass effect in the glass body outline, because of how much glass is required to fill each of these optional slug configurations.

A common feature of the embodiments of the present invention illustrated in FIGS. 5A-5D is to provide slug geometry permitting adequate glass flow during high temperature sealing into the slug recess geometry and across the top planar side of the die between, for example, the anode and cathode. These design features may be valuable for high voltage devices that require these special considerations including maximizing distances to avoid arc-over between anode and cathode.

Figure 6A:
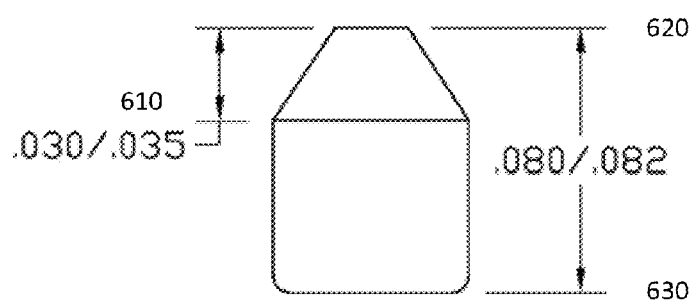
FIGS. 6A-6C illustrate three views of a tapered slug according to certain embodiments of the present invention.
Figure 6B:
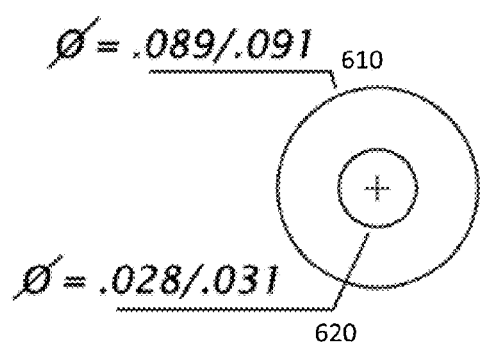
Figure 6C:
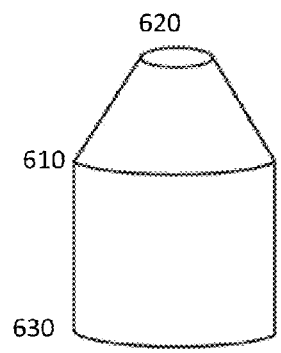

FIGS. 6A-6C illustrate three views of an exemplary tapered slug according to certain embodiments of the present invention. FIG. 6A illustrates that the distance from the shoulder or beginning of the taper 610 to the top 620 of the taper and slug may be about 0.030 to about 0.035 inches. The distance from the top 620 of the slug to the bottom 630 of the slug may be about 0.080 to about 0.082 inches.

FIG. 6B illustrates a top view of this exemplary slug. As shown in FIG. 6B, the diameter (ø) of the slug at the shoulder 610 may be about 0.089 to about 0.091 inches. The diameter of the slug at the top 620 may be about 0.028 to about 0.031 inches. FIG. 6C illustrates a perspective view of this exemplary slug, the foregoing dimensions of the slug being for purposes of example only, as any desired dimensions may be used.

Figure 7:
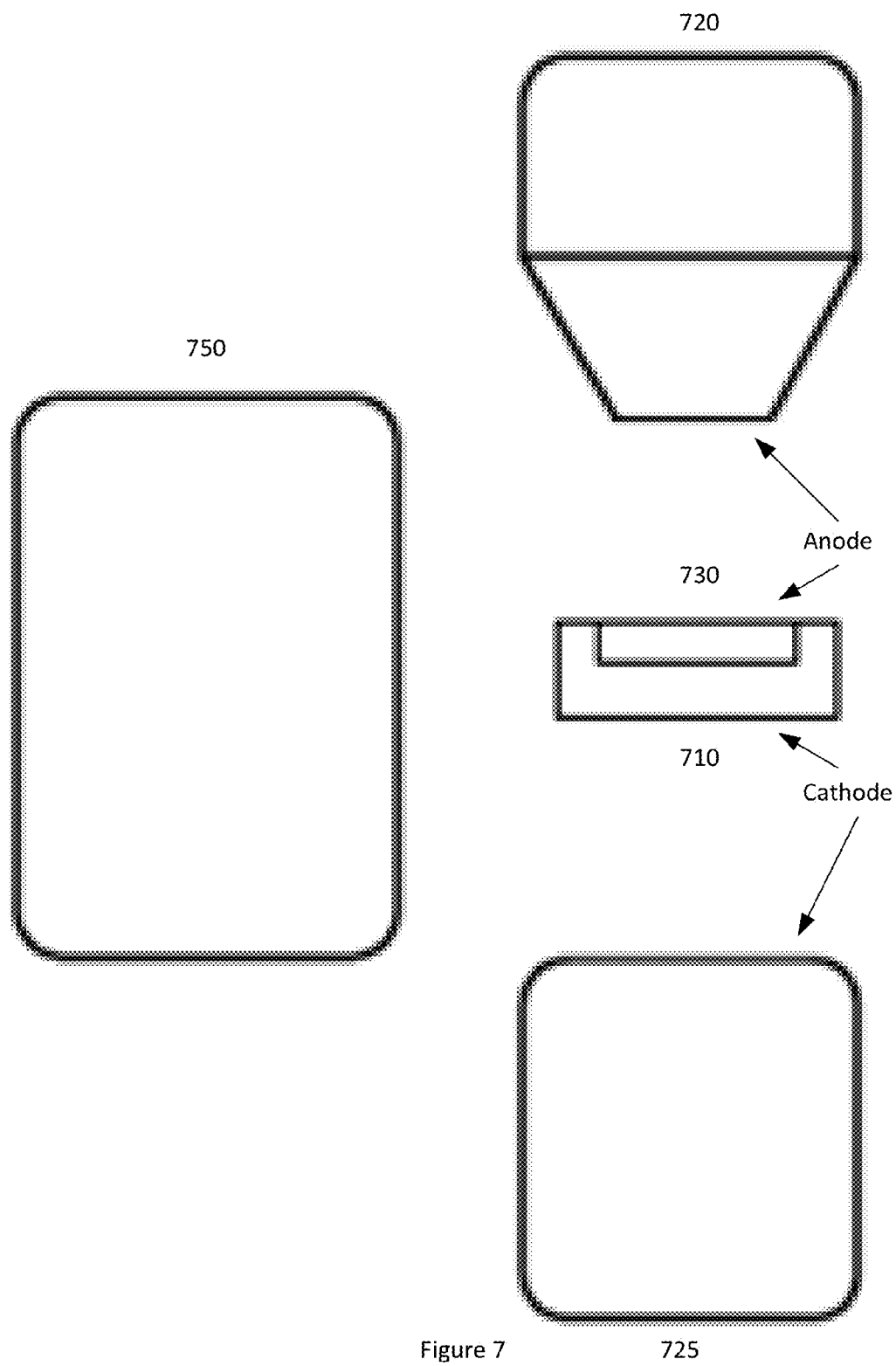
FIG. 7 illustrates an exploded view of a package according to certain embodiments of the present invention.

FIG. 7 illustrates an exploded view of a package according to certain embodiments of the present invention. As shown in FIG. 7, a die 710 may be provided with a patterned area 730, which may include a metal area. A first slug 720 may be provided as a tapered slug and a second slug 725 may be provided as an untapered or cylindrical slug. Furthermore, there may also be provided a high dielectric strength glass sleeve body 750. The glass sleeve body 750 is illustrated in its approximate shape after installation, because this is an exploded view. However, prior to assembly, the glass sleeve body 750 may more closely resemble a regular cylinder. During assembly, the glass sleeve body 750 may conform more closely to the shape of the package and may obtain the rounded ends illustrated in FIG. 7. Not illustrated, sides of the glass sleeve body 750 may collapse inward, yielding an overall hour-glass appearance for the glass sleeve body 750.

The anode of the devices may be on the mesa side of a mesa die or on the pattern side of a planar die, such as die 710. However, a reversed polarity is also possible, depending on the p or n type starting material in either silicon or SiC before the junction is formed in the wafer fabrication process. For example, FIG. 7 shows area 730 as the anode and area 710 as the cathode on the die. Likewise, the tapered slug region 720 can be electrically equivalent to the anode and the cylindrical slug 725 can be electrically equivalent to the cathode.

Figure 8:
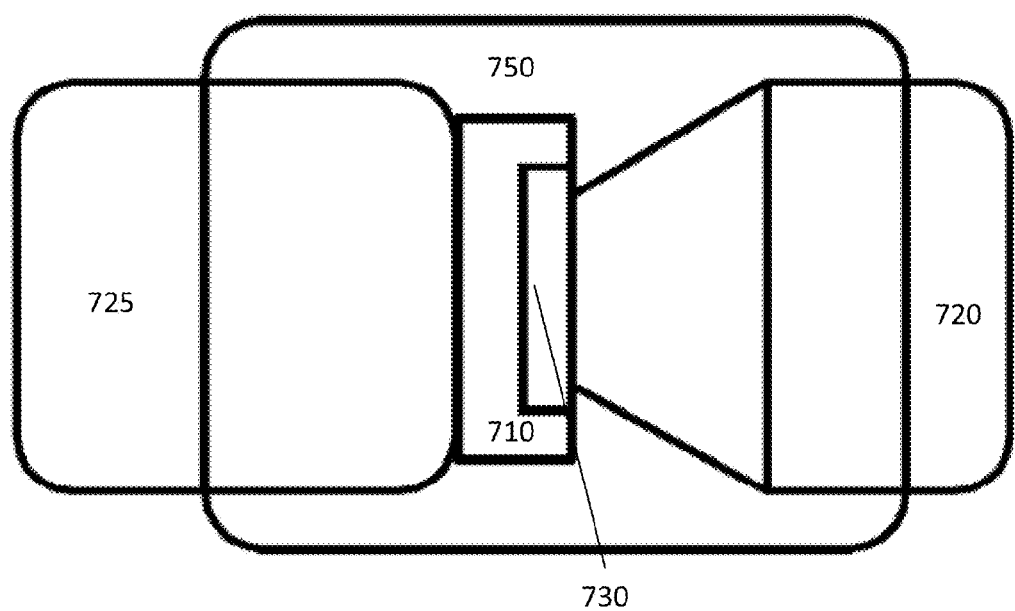
FIG. 8 illustrates an assembled view of a package according to certain embodiments of the present invention.

FIG. 8 illustrates an assembled view of a package according to certain embodiments of the present invention. The elements of the package of FIG. 8 may be the same as those of FIG. 7, as discussed above.

For the first slug 720 and the second slug 725, pure tungsten (or any other desired material) can be used, having a coefficient of thermal expansion (CTE) of 4.5 ppm/° C. (or any other desired CTE). For example, molybdenum, with a CTE of 4.9 ppm/° C., can be used. These CTEs can closely match the CTE of silicon (4 ppm/° C.) or Silicon Carbide in the die 710. These CTE values can also be closely matched with the glass body material selection such as Schott 8651 or 8652 glass (4.5 ppm/° C.) for the high dielectric strength body 750. The result may be a glass compression seal resulting in an overall package design that is thermally matched. Such thermal matching may permit the package to withstand extreme temperatures to compliment very high operating temperature capability of some SiC Schottkys designs up to 300° C., when using higher barrier metals such as NiSi in the wafer fabrication process.

Certain embodiments of the present invention may also be valuable for high voltage designs (600 V and higher) for very robust package designs and severe temperature environments without wire bonds or other fragile components. The described Schott 8651 or 8652 glass has a high dielectric strength (20-40 kV/mm). However, other high dielectric strength materials are also permitted.

Figures 9A, 9B:
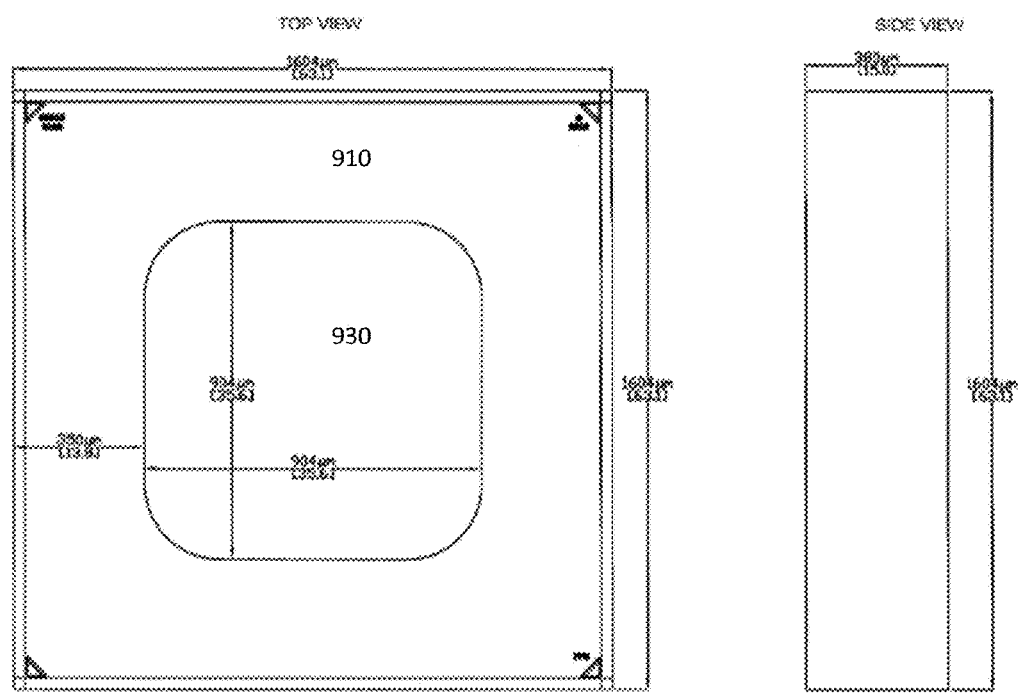
FIGS. 9A and 9B illustrate a die for use with certain embodiments of the present invention.

FIGS. 9A and 9B illustrate an exemplary die for use with certain embodiments of the present invention. FIG. 9A illustrates a top view of the die 910. As shown in FIG. 9A, the die 910 may be approximately square having sides of approximately 1600 microns, for example, 1604 microns. A patterned area 930 on the surface of the die 910 may have a rounded square shape with a distance between parallel sides of about 900 microns, for example 904 microns. The remaining area of the surface of the die 910 may be covered with a passivation layer. FIG. 9B illustrates a side view of the die 910. As shown in FIG. 9A, the thickness of the die may be about 380 microns.

The die 910 may be provided with 8000 angstroms of a top metal layer. The top metal layer may comprise layers of titanium, platinum, and gold. For example, the titanium layer may be 500 angstroms thick, the platinum layer may be 500 angstroms thick, and the gold layer may be 7000 angstroms thick. The die 910 may also be provided with a backside metal layer of 0.65 microns thickness. The back metal layer may also comprise layers of titanium, platinum, and gold. For example, the titanium layer may be 500 angstroms thick, the platinum layer may be 1000 angstroms thick, and the gold layer may be 5000 angstroms thick. There may also be a barrier metal supplied. The barrier metal may be a layer of NiSi that is 400 angstroms thick. Other sizes, layouts and materials may be used for any die used with embodiments of the present invention.

Certain embodiments of the present invention relate to a device in which a tapered plug side contacts a planar patterned portion of the die as the anode on one side and the opposite side as the cathode with a cylindrical plug when also used for a high voltage SiC Schottky. Nevertheless, this can be electrically reversed in polarity for other planar die designs in other embodiments, including any SiC Transient Voltage Suppressors, Silicon Schottkys, or others forms of planar die used for rectifier diode configurations. Certain embodiments of the present invention, therefore, may be employed with high voltage individual die or multiple dies stacked in series with additional tapered disc contacts included between the dies.

If die orientation during assembly is to be avoided, where the planar patterned side of the die faces the tapered slug, a tapered slug could also be used on the other side instead of just on one side. Such a configuration may also apply to planar die stacked in series and opposite direction for bidirectional SiC Transient Voltage Suppressors including those that are for high voltage applications.

Embodiments of the present invention may have various benefits. For example, certain embodiments of the present invention may provide contact to a smaller metalized anode contact window of the planar die design. Moreover, certain embodiments of the present invention may provide additional internal clearance distance between the smaller anode metalized region and the die edge or substrate (cathode region) to avoid dielectric breakdown for higher voltage applications such as SiC Schottkys. Moreover, certain embodiments of the present invention may provide a sufficient space for a much higher dielectric strength glass to flow into and around the die region between anode and cathode during assembly-sealing to also prevent internal arc-over. The various tapered slug embodiments of the present invention may still provide an intimate flat contact area to the metalized anode contact window of the planar die with the adjoining Tungsten or Molybdenum plug at high sealing temperatures that also provides very good contact bond qualities, as defined by MIL-PRF-19500 for a "Category III" Metallurgical Bond. MIL-PRF-19500 is hereby incorporated herein by reference in its entirety.

Certain embodiments of the present invention also can avoid reliance on internal coatings, gels, or internal sealed pressure to prevent arc-over as might otherwise be needed on cavity devices for high voltage SiC Schottkys. Certain embodiments of the present invention may also permit reduction in the amount of anode-to-cathode spacing at the planar die design level in this voidless glass packaging for high voltage applications. As a result, larger size metalized die contacts may be used with the high dielectric strength and hermetic properties of the glass (or other insulating or dielectric material) that also flows around the die surface between anode and cathode. This additional larger metalized contact design option for high voltage die designs may also permit corresponding improved electrical and thermal performance features after assembly.

The application possibilities are extensive for package designs according to various embodiments of the present invention. For example, in certain embodiments of the present invention, the voidless glass package design for high voltages includes a high-dielectric-strength glass that also covers the active SiC die element from anode to cathode. Moreover, certain embodiments of the present invention may use a specialized Tungsten plug design for contacting the pattern (anode) side of the SiC Schottky element and its planar die design inside the package. As a result, there may be no requirement of dependency on internal silicone coatings, gels, organic compounds, or reliance on pressure internally for preventing high voltage arc-over in cavity devices over long periods of time, as mentioned above.

For a high temperature option according to certain embodiments of the present invention, copper leads can be unplated for weld mounting to ensure compatibility for temperatures up to, for example, 300° C. These glass package designs can be provided in both axial-leaded and surface mount configurations, where their terminations are at opposite ends of the package to maximize distance separation.

For applications requiring very high voltages, such as 1200 V, these types of voidless glass packages may also have sufficient distances between external terminations to avoid problems with clearance and creepage to avoid arc-over when mounting these devices. This can be particularly valuable for any applications operating in low pressure or high altitude environments, where the dielectric breakdown strength of air (Paschen Curve) significantly declines.

With unique high temperature capabilities up to 300° C. in a voidless glass package, the same package design can also be applied to lower Schottky barrier height designs for achieving lower forward voltage features with lower temperature ratings, such as 150° C. Those further design options may still include the higher reverse voltage ratings and very fast switching speed capabilities of a Schottky. Regardless of the high or low barrier height selection for desired range of temperature operation, these combined electrical characteristic options may be beneficial for higher voltage applications requiring minimal switching losses and ringing effects that otherwise occur from the recovery charge in conventional fast or ultrafast silicon p-n junction rectifiers.

A system in certain embodiments of the present invention can include a semiconductor die having a first side and a second side opposite the first side. For example, as shown in FIG. 2, the first side can be the top side of the die.

The system can also include a first slug coupled to a portion of the first side of the die. Referring to FIG. 2, this can be the slug with the tapered end.

The system can also include a second slug coupled to a portion of the second side of the die. This can be the cylindrical slug shown in FIG. 2, but can optionally be identical or similar to the first slug. For example, the shape and size of the second slug can be substantially identical to the shape and size of the first slug as in FIG. 3. The system can also include an insulating material voidlessly encapsulating the die, such as the glass shown in FIG. 2.

The first slug can include a first portion having a first width in proximity to the die and a second portion having a second width. The first portion can be closer than the second portion to the die and the first width can be smaller than the second width. The first portion can correspond to the portion from top portion 620 to the shoulder 610, as shown in FIG. 6. The second portion can correspond to the remainder of the slug illustrated in FIG. 6.

For example, the first portion can include a truncated cone. The slope of the cone can be approximately N degrees off an axis of the cone, where N is from about 10 degrees to about 80 degrees. The slope of the cone can be approximately 45 degrees off an axis of the cone.

As shown, for example, in FIG. 5B, the first portion can include a cylinder having a smaller width than the second portion. Alternatively, the first portion can vary from the first width to the second width to form a convex surface, a concave-convex surface (see, for example, FIG. 5D), or a concave surface (see, for example, FIG. 5C).

The semiconductor die can be a planar die. For example, the semiconductor die can be a silicon carbide die in a planar configuration. As described above, the first slug can be molybdenum, tungsten or any other desired material. In other words, either of those elements can be pure or alloyed with one another or with other elements that do not significantly change the coefficient of thermal expansion and conductivity of the slug.

The planar die can have a width approximately equal to the second width of the slug. For example, when the planar die is square or hexagonal, the planar die can have a major diagonal approximately equal to the second width of the slug. Moreover, when the first slug has a circular cross-section, the first width of the slug can correspond to a first diameter of the slug and the second width of the slug can correspond to a second diameter of the slug.

The first width can correspond to a metallization area on a surface of the die. In other words, the slug can be configured to align with the metallization area in certain embodiments of the present invention.

The planar die can include a passivation layer in an area corresponding to a difference between the second width and the first width, such as the passivation layer shown in FIG. 2. The insulating material can be a high-dielectric-strength glass, such as the glass sleeve body shown in FIG. 2, although any other desired material may be used.

The first slug can be provided with a lead, a surface mount connector or any other desired connector. These can be copper or any other desired conductive material.

In certain embodiments of the present invention, the system can further include a second semiconductor die located adjacent to the semiconductor die. The second semiconductor die can be arranged between the semiconductor die and the second slug. The second semiconductor die can be arranged back-to-back with the semiconductor die. Both the first slug and the second slug can be tapered in such an embodiment.

Moreover, in certain embodiments, the system can additionally include a second semiconductor die located between the second slug and a third slug on an opposite side of the second slug from the semiconductor die. Optionally, multiple such interleafed slugs and dies can be arranged in series.

By way of example, the system can be incorporated into a printed circuit board, a power supply, and/or a satellite.

Figure 10:
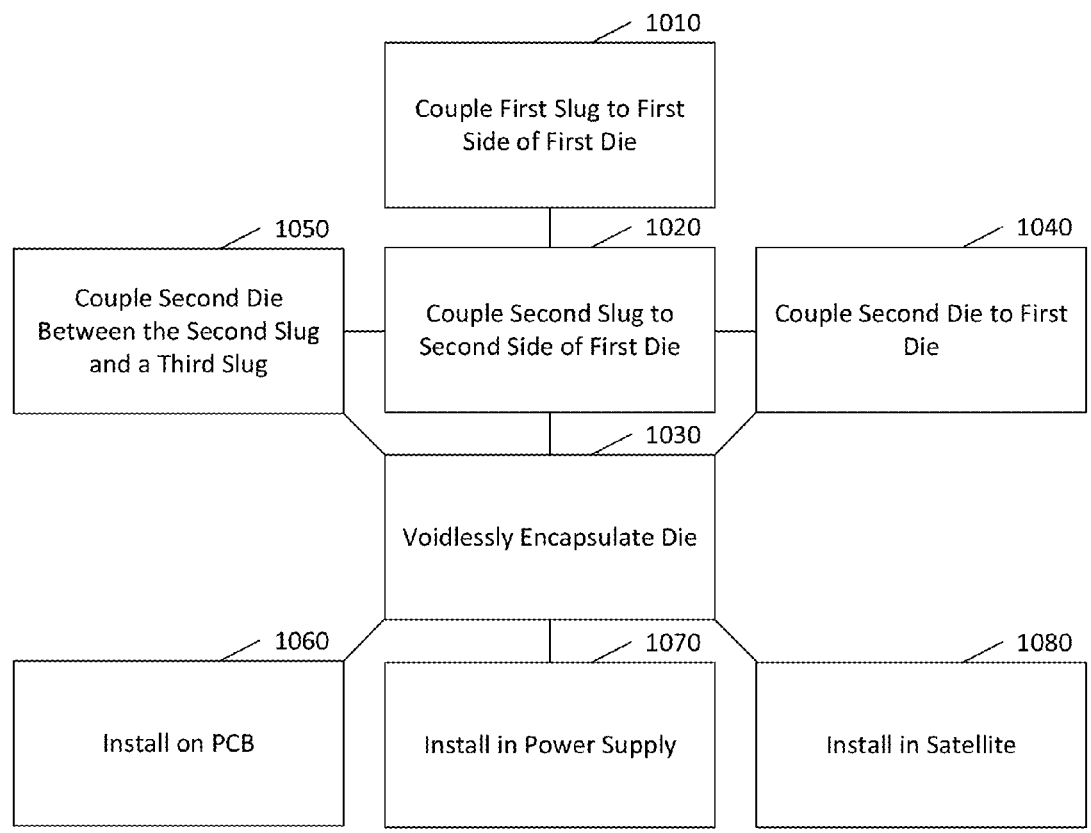
FIG. 10 illustrates a method according to certain embodiments of the present invention.

FIG. 10 illustrates a method according to certain embodiments of the present invention. The illustrated method may be a method of manufacturing the system described above, in any of its variations. For example, a method of manufacture can include, at 1010, coupling a first slug to a portion of a first side of a semiconductor die having the first side and a second side opposite the first side. The method can also include, at 1020, coupling a second slug to a portion of the second side.

The method can further include, at 1030, voidlessly encapsulating the die with an insulating body material. The first slug can include a first portion having a first width in proximity to the die and a second portion having a second width. The first portion can be closer than the second portion to the die and the first width may be smaller than the second width.

The method can additionally include, at 1040, prior to the encapsulating, coupling a second semiconductor die adjacent to the semiconductor die. Additionally or alternatively, the method can include, at 1050, coupling a second semiconductor die between the second slug and a third slug on an opposite side of the second slug from the semiconductor die.

Any of these described couplings can also be done simultaneously in the packaging assembly and sealing process.

The method can also include, at 1060, installing the die, first slug, and second slug on a printed circuit board (PCB). The method can further include, at 1070, installing the die, first slug, and second slug in a power supply. Optionally, the PCB can be installed in the power supply. The method can also include installing the die, first slug, and second slug in a satellite system.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

I claim:

1. A system, comprising:
   a semiconductor die having a first side and a second side opposite the first side;
   a first slug coupled to a portion of the first side of the die;
   a second slug coupled to a portion of the second side of the die; and
   an insulating material voidlessly encapsulating the die,
   wherein the first slug includes a first portion having a first width in proximity to the die and a second portion having a second width, wherein the first portion is closer than the second portion to the die and the first width is smaller than the second width, and
   wherein the semiconductor die comprises a silicon carbide die.

2. The system of claim 1, wherein the first portion comprises a truncated cone.

3. The system of claim 2, wherein the slope of the cone is approximately N degrees off an axis of the cone and N comprises a value between 10 degrees and 80 degrees.

4. The system of claim 3, wherein the slope of the cone is approximately 45 degrees off the axis of the cone.

5. The system of claim 1, wherein the first portion comprises a cylinder having a smaller width than the second portion.

6. The system of claim 1, wherein the first portion varies from the first width to the second width to form one of a convex surface, a concave-convex surface, and a concave surface.

7. The system of claim 1, wherein the semiconductor die comprises a planar die.

8. The system of claim 1, wherein the first slug comprises one of molybdenum and tungsten.

9. The system of claim 1, wherein the shape and size of the second slug is substantially identical to the shape and size of the first slug.

10. The system of claim 1, wherein the semiconductor die has a width approximately equal to the second width.

11. The system of claim 10, wherein, when the semiconductor die includes a cross section that is one of a square or a hexagon, the semiconductor die has a major diagonal approximately equal to the second width.

12. The system of claim 10, wherein, when the first slug is cylindrical, the first width corresponds to a first diameter of the slug and the second width corresponds to a second diameter of the slug.

13. The system of claim 1, wherein the semiconductor die includes a passivation layer in an area corresponding to a difference between the second width and the first width.

14. The system of claim 1, wherein the insulating material comprises a high dielectric strength glass.

15. The system of claim 1, wherein the first width corresponds to a metallization area on a surface of the semiconductor die.

16. The system of claim 1, wherein the first slug is provided with one of a lead or a surface mount connector.

17. A system, comprising:
- a semiconductor die having a first side and a second side opposite the first side;
- a first slug coupled to a portion of the first side of the die;
- a second slug coupled to a portion of the second side of the die;
- a second semiconductor die located adjacent to the semiconductor die; and
- an insulating material voidlessly encapsulating the die,
- wherein the first slug includes a first portion having a first width in proximity to the die and a second portion having a second width, wherein the first portion is closer than the second portion to the die and the first width is smaller than the second width.

18. The system of claim 17, wherein the second semiconductor die is arranged between the semiconductor die and the second slug.

19. The system of claim 17, wherein the second semiconductor die is arranged back-to-back with the semiconductor die and wherein both the first slug and the second slug are tapered.

20. A system, comprising:
- a semiconductor die having a first side and a second side opposite the first side;
- a first slug coupled to a portion of the first side of the die;
- a second slug coupled to a portion of the second side of the die;
- a second semiconductor die located between the second slug and a third slug; and
- an insulating material voidlessly encapsulating the die,
- wherein the first slug includes a first portion having a first width in proximity to the die and a second portion having a second width, wherein the first portion is closer than the second portion to the die and the first width is smaller than the second width.

21. The system of claim 20, further comprising a third semiconductor die located between the third slug and a fourth slug.

22. A printed circuit board comprising the system of claim claim 1.

23. A power supply comprising the system of claim 1.

24. A satellite system comprising the system of claim 1.

25. A method of manufacture, comprising:
- coupling a first slug to a portion of a first side of a semiconductor die having the first side and a second side opposite the first side;
- coupling a second slug to a portion of the second side; and
- voidlessly encapsulating the die with an insulating material;
- wherein the first slug includes a first portion having a first width in proximity to the die and a second portion having a second width, wherein the first portion is closer than the second portion to the die and the first width is smaller than the second width, and
- wherein the semiconductor die comprises a silicon carbide die.

26. The method of claim 25, wherein the first portion comprises a truncated cone.

27. The method of claim 25, wherein the semiconductor die comprises a planar die.

28. The method of claim 25, wherein the first slug comprises one of molybdenum and tungsten.

29. The method of claim 25, wherein the shape and size of the second slug is substantially identical to the shape and size of the first slug.

30. The method of claim 25, wherein the semiconductor die has a width approximately equal to the second width.

31. The method of claim 25, wherein the semiconductor die includes a passivation layer in an area corresponding to a difference between the second width and the first width.

32. The method of claim 25, wherein the insulating material comprises a high dielectric strength glass.

33. The method of claim 25, wherein the first width corresponds to a metallization area on a surface of the semiconductor die.

34. The method of claim 25, wherein the first slug is provided with one of a lead or a surface mount connector.

35. The method of claim 25, further comprising installing the semiconductor die, the first slug, and the second slug on a printed circuit board.

36. The method of claim 25, further comprising installing the semiconductor die, the first slug, and the second slug in a power supply.

37. The method of claim 25, further comprising installing the semiconductor die, the first slug, and the second slug in a satellite system.

38. A method of manufacture, comprising:
- coupling a first slug to a portion of a first side of a semiconductor die having the first side and a second side opposite the first side;
- coupling a second slug to a portion of the second side;
- coupling a second semiconductor die between the second slug and a third slug; and
- voidlessly encapsulating the die with an insulating material;
- wherein the first slug includes a first portion having a first width in proximity to the die and a second portion having a second width, wherein the first portion is closer than the second portion to the die and the first width is smaller than the second width.

39. A method of manufacture, comprising:
- coupling a first slug to a portion of a first side of a semiconductor die having the first side and a second side opposite the first side;
- coupling a second slug to a portion of the second side;
- coupling a second semiconductor die adjacent to the semiconductor die; and
- voidlessly encapsulating the die with an insulating material;
- wherein the first slug includes a first portion having a first width in proximity to the die and a second portion having a second width, wherein the first portion is closer than the second portion to the die and the first width is smaller than the second width.

40. The method of claim 39, wherein the second semiconductor die is arranged between the semiconductor die and the second slug.

41. The method of claim 39, wherein the second semiconductor die is arranged back-to-back with the semiconductor die and wherein both the first slug and the second slug are tapered.

42. The method of claim 38, further comprising coupling a third semiconductor die between the third slug and a fourth slug.

* * * * *